United States Patent
Buller et al.

(10) Patent No.: US 9,245,808 B2
(45) Date of Patent: Jan. 26, 2016

(54) METHOD AND SYSTEM FOR IN-LINE REAL-TIME MEASUREMENTS OF LAYERS OF MULTILAYERED FRONT CONTACTS OF PHOTOVOLTAIC DEVICES AND CALCULATION OF OPTO-ELECTRONIC PROPERTIES AND LAYER THICKNESSES THEREOF

(71) Applicant: FIRST SOLAR, INC, Perrysburg, OH (US)

(72) Inventors: Benyamin Buller, Sylvania, OH (US); Douglas Dauson, Perrysburg, OH (US); David Hwang, Perrysburg, OH (US); Scott Mills, Perrysburg, OH (US); Dale Roberts, Holland, MI (US); Rui Shao, Sylvania, OH (US); Zhibo Zhao, Novi, MI (US)

(73) Assignee: FIRST SOLAR, INC., Perrysburg, OH (US)

( * ) Notice: Subject to any disclaimer, the term of this patent is extended or adjusted under 35 U.S.C. 154(b) by 0 days.

(21) Appl. No.: 14/133,946

(22) Filed: Dec. 19, 2013

(65) Prior Publication Data
US 2014/0186975 A1    Jul. 3, 2014

Related U.S. Application Data

(60) Provisional application No. 61/746,424, filed on Dec. 27, 2012.

(51) Int. Cl.
*H01L 21/00* (2006.01)
*H01L 21/66* (2006.01)
(Continued)

(52) U.S. Cl.
CPC ............ *H01L 22/12* (2013.01); *G01B 11/0625* (2013.01); *H01L 31/022425* (2013.01); *H01L 31/022466* (2013.01); *H01L 31/1884* (2013.01); *H02S 50/00* (2013.01); *Y02E 10/50* (2013.01)

(58) Field of Classification Search
CPC .................. H01L 21/67242; H01L 21/67253; H01L 21/67288; H01L 22/12; H01L 31/022466; H01L 31/1884
USPC ............................................... 438/7, 8, 9, 16
See application file for complete search history.

(56) References Cited

U.S. PATENT DOCUMENTS

| 5,604,581 | A | 2/1997 | Liu et al. |
| 5,648,849 | A | 7/1997 | Canteloup et al. |

(Continued)

FOREIGN PATENT DOCUMENTS

| EP | 2 390 905 A1 | 11/2011 |
| WO | WO 2009/143921 A1 | 12/2009 |
| WO | WO 2012/006611 A2 | 1/2012 |

OTHER PUBLICATIONS

Bin Fan et al., "In Situ Optical Monitor System for CIGS Solar Cell Applications", Chinese Optics Letters, vol. 8, No. SUPPL., Jan. 1, 2010, pp. 186-188.

(Continued)

*Primary Examiner* — Kevin M Picardat
(74) *Attorney, Agent, or Firm* — Dickstein Shapiro LLP

(57) ABSTRACT

A method and system for real-time, in-line calculations of opto-electronic properties and thickness of the layers of multi-layered transparent conductive oxide stacks of photovoltaic devices is provided. The method and system include taking measurements of each layer of the stack during deposition thereof. The measurements are then used to calculate the opto-electronic properties and thicknesses of the layers in real-time.

29 Claims, 7 Drawing Sheets

(51) Int. Cl.
*G01B 11/06* (2006.01)
*H01L 31/0224* (2006.01)
*H01L 31/18* (2006.01)
*G01R 31/40* (2014.01)

(56) References Cited

U.S. PATENT DOCUMENTS

| | | | |
|---|---|---|---|
| 5,768,471 | A | 6/1998 | Meredith, Jr. |
| 6,319,093 | B1 | 11/2001 | Lebel et al. |
| 6,525,829 | B1 | 2/2003 | Powell et al. |
| 8,796,048 | B1 * | 8/2014 | Thompson et al. ............. 438/14 |
| 8,805,567 | B2 * | 8/2014 | Lee et al. ...................... 700/121 |
| 8,893,650 | B2 * | 11/2014 | Kaneda .......................... 118/712 |
| 8,941,809 | B2 * | 1/2015 | Kanaoka .......................... 355/53 |
| 2003/0090676 | A1 | 5/2003 | Goebel et al. |
| 2005/0178651 | A1 | 8/2005 | Ranjan et al. |
| 2007/0036198 | A1 | 2/2007 | Brcka |
| 2009/0013072 | A1 | 1/2009 | Kato |
| 2011/0089348 | A1 | 4/2011 | Finarov et al. |
| 2012/0021539 | A1 | 1/2012 | Allenic et al. |
| 2012/0041583 | A1 | 2/2012 | Conley et al. |
| 2012/0060891 | A1 | 3/2012 | Buller et al. |

OTHER PUBLICATIONS

Roland Scheer et al., "Advances Diagnostic and Control Methods of Processes and Layers in CIGS Solar Cells and Modules", Progress in Photovoltaics: Research and Application, Jon Wiley & Sons, LTD., vol. 18, Sep. 1, 2010, pp. 467-480.

F.A. Abou-Elfotouh et al., "Broad Band Spectroscopic Ellipsometry for the Characterization of Photovoltaic Materials", Solar Cells, Elsevier Sequoia.S.A. Lausanne, CH, vol. 30, No. 1/04, May 1, 1991, pp. 473-485.

* cited by examiner

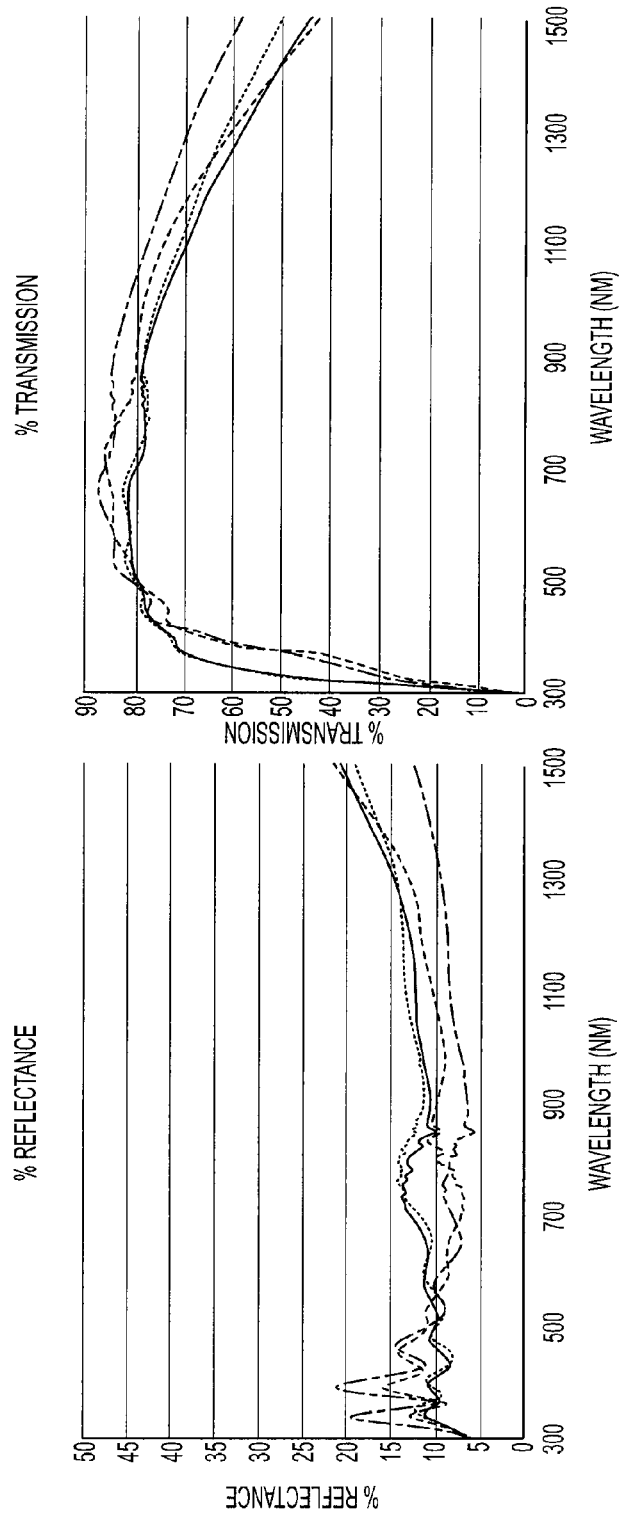

METHOD AND SYSTEM FOR IN-LINE REAL-TIME MEASUREMENTS OF LAYERS OF MULTILAYERED FRONT CONTACTS OF PHOTOVOLTAIC DEVICES AND CALCULATION OF OPTO-ELECTRONIC PROPERTIES AND LAYER THICKNESSES THEREOF

CROSS-REFERENCE TO RELATED APPLICATION

This application claims priority to U.S. Provisional Application No. 61/746,424, filed Dec. 27, 2012, which is hereby fully incorporated by reference.

FIELD OF THE INVENTION

The disclosed embodiments relate generally to photovoltaic devices, and more particularly, to a system and method of measuring, in real-time, opto-electronic properties and layer thicknesses of multilayered front contacts of photovoltaic devices.

BACKGROUND OF THE INVENTION

A variety of thin-film photovoltaic devices, such as cells and modules, are known. Multilayered transparent conductive oxide (TCO) stacks are commonly used as support and contact (electrode) for these photovoltaic devices. The TCO stacks have opto-electronic properties, which can directly affect the devices' performance. The opto-electronic properties include electrical conductivity and optical transparency, both of which depend on thicknesses of the layers in the multilayered TCO stacks. Optical transparency is related to optical constants such as refractive index (n), and extinction coefficient (k). The refractive index of a material describes how light propagates through that material. It is a measure of how a wavelength and velocity of light are reduced when propagated through the material as compared to the wavelength and velocity of propagation through a vacuum. The extinction coefficient is a constant that relates to the absorption of light in a material.

Thus, to ensure a consistent performance across devices or batches of devices, it is necessary that the thickness and optical constant values of each layer of a TCO stack be consistent from one TCO stack to another. To do so, the thickness and optical constant values of each of the individual layers in the TCO stacks have to be controlled as the stacks are being formed. To control the thicknesses of the layers as the TCO stacks are being formed, the thickness of the layers must be measured in real-time (i.e., as the layers are being formed) or near real-time.

One method that has been used previously to obtain thicknesses of individual layers of a device is to take microscopic cross-sectional measurements of the device. Microscopic cross-sectional measurements includes cutting open a previously-fabricated device to expose its cross-sectional layers and using an electron microscope (or other microscopic measurement tool) to measure the thickness of each exposed layer.

To ensure that the thicknesses of the layers do not deviate too much from one device to another, the microscopic cross-sectional measurements should be taken on a fairly regular basis. Doing so, however, may slow down the manufacturing line as layer deposition may have to be stopped awaiting the results of the measurements to determine whether adjustments to the deposition equipment are needed. Further, since the device is destroyed in order to take the measurements, additional costs may be added to the photovoltaic devices. Obtaining values for the optical constants of the layers is equally, if not more, challenging.

Hence, in-line measurements of the thickness and optical constant values of the layers of a TCO stack would be preferable, not only to prevent the need for device destruction, but also to allow measurements of each layer of the device in real-time. Real-time layer measurements may allow, for example, for real-time correction of undesired manufacturing variances. It would therefore be desirable to perform an accurate real-time, non-destructive calculation of layer thicknesses and optical properties thereof for the layers of the TCO stack.

BRIEF DESCRIPTION OF THE DRAWINGS

FIGS. 6A and 6B, respectively, show sample reflection and transmission curves.

DETAILED DESCRIPTION OF THE INVENTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Figure 1:
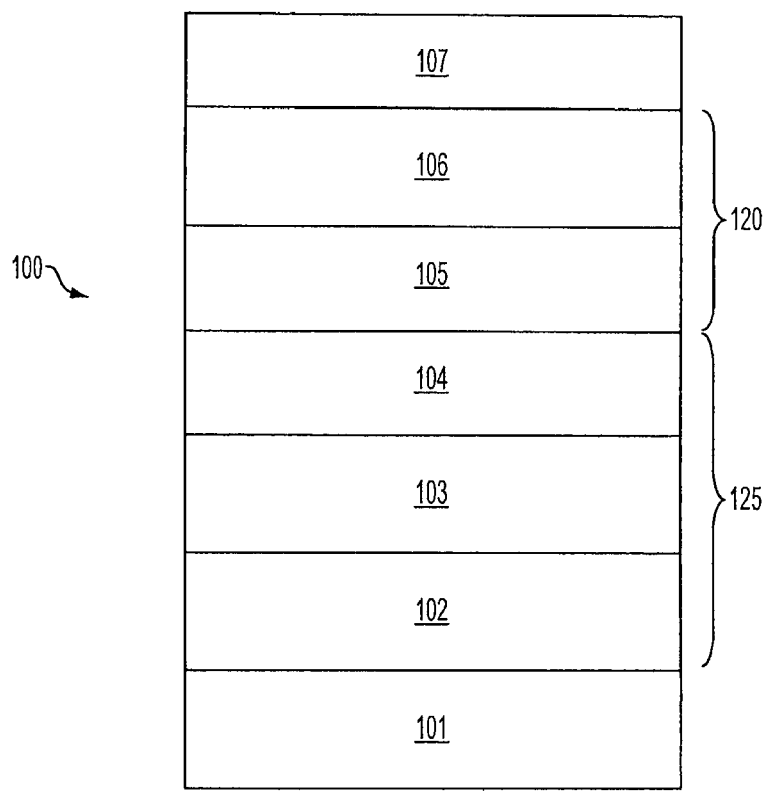
FIG. 1 is a schematic representation of a photovoltaic device.

Referring to the figures, FIG. 1 shows one example of a general structure of a photovoltaic (PV) device 100. The photovoltaic device 100 includes a TCO stack 125 formed over substrate 101. The TCO stack 125 may include a barrier layer 102, a TCO layer 103 and a buffer layer 104. The photovoltaic device also includes semiconductor layer(s) 120 which include a semiconductor window layer 105 formed adjacent a semiconductor absorber layer 106. A back contact (electrode) 107 can be formed adjacent to semiconductor layer(s) 120. Some PV devices may include a back cover (not shown) deposited over the back contact 107.

The substrate 101 and the back cover are used to protect the PV device 100 against environmental hazards. Since incident light has to go through the substrate 101 to reach the semiconductor(s) 120 where it is converted to electricity, the substrate 101 needs to be optically transparent. Therefore, the substrate 101 may be made of glass such as soda-lime glass. For aesthetic purposes, the back cover may also be made of glass or may be made of other materials.

Barrier layer 102 is used to lessen sodium diffusion to other layers in the device. Specifically during fabrication and while in operation, the device may be subjected to high temperatures. The high temperatures may disassociate sodium atoms from other atoms in the glass. These disassociated sodium atoms may become mobile ions and may diffuse into other layers of the device. Diffusion of sodium ions in the TCO layer 103 may adversely affect the TCO layer's optical and electrical properties which may lead to deteriorating performance of the device 100. Likewise, diffusion of sodium ions in the semiconductor layers 120 may adversely affect device efficiency. Hence, the barrier layer 102 is used to reduce diffusion of sodium ions to those layers. A variety of materials may be used for the barrier layer 102, such as a silicon nitride, silicon oxide, aluminum-doped silicon oxide, boron-doped silicon nitride, phosphorus-doped silicon nitride, silicon oxide-nitride, or any combination or alloy thereof. Barrier layer 102 may also include a bi-layer of a silicon oxide deposited over a silicon nitride (or an aluminum-doped silicon nitride).

The TCO layer 103 and the back contact 107 serve as electrodes through which the electricity generated by the PV device 100 may be provided externally. The TCO 103, just as in the case of the substrate 101, needs to let light therethrough and therefore can be made of a transparent conductive material such as cadmium stannate, aluminum doped zinc oxide, or tin oxide doped with fluorine. In the present embodiment, the TCO 103 may be made of cadmium stannate as it exhibits high optical transmission and low electrical sheet resistance. The back contact 107 does not have any transparency requirement and thus may be made of a metal such as Mo, Al, Cu, Ag, Au, or a combination thereof.

Buffer layer 104 can facilitate proper deposition of the semiconductor window layer(s) 120. The buffer layer 104 is used to provide a smooth surface on which the semiconductor layer(s) 120 are formed. Certain deposition systems that may be used to deposit the TCO layer 103 may provide a TCO layer 103 with a rather rough surface. In such instances, if a thin window layer 105 were to be formed over the rough TCO layer 103, there might be some discontinuities in the window layer 105, which may decrease the device's performance. To avoid such discontinuities, the buffer layer 104 may be provided between the rough TCO layer 103 and the window layer 105. The buffer layer 104 can include various suitable materials, including tin oxide (e.g., tin (IV) oxide), zinc tin oxide, zinc oxide, zinc magnesium oxide, and zinc oxysulfide.

Semiconductor layer(s) 120 can be deposited on TCO stack 125 and can include any suitable semiconductor layer (s), including, for example a semiconductor bi-layer. The semiconductor bi-layer may include an n-type semiconductor window layer 105 in close proximity to a p-type semiconductor absorber layer 106 to form a p-n junction where solar energy may be converted to electricity. The p-type semiconductor absorber layer 106 may be made of cadmium telluride. Alternatively, the p-type semiconductor layer may be made of copper-indium-gallium-selenium (CIGS) material. The n-type semiconductor window layer 105 may be made of cadmium sulfide. The window layer 105 allows the solar energy to penetrate through to the absorber layer 106. The n- and p-type semiconductor layer(s) 120 can also be of any Group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AN, AlP, AlAs, AlSb, GaN, GaP, GaAs, GaSb, InN, InP, InAs, InSb, TlN, TlP, TlAs, TlSb, or mixtures or alloys thereof.

Note that each of these layers may be composed of more than one layer or film. Additionally, each layer can cover all or a portion of the device and/or all or a portion of the layer or substrate underlying the layer. For example, a "layer" can mean any amount of material that contacts all or a portion of a surface. Each of the layers can be deposited using any known deposition technique, including, but not limited to, sputtering, closed space sublimation (CSS), and vapor transport deposition (VTD), among others. These deposition techniques are well known in the industry and will not herein be described.

As previously discussed, the opto-electronic properties of the TCO stack 125 can directly affect the performance of the photovoltaic device 100. For example, the TCO layer 103, being one of the two electrodes used by the photovoltaic device 100 to provide electricity to external devices, needs to be highly conductive; otherwise the performance of the device 100 may suffer. Further, the higher the optical transparency of each one of the layers in the TCO stack 125, the better the device 100 will perform since, in such cases, a high amount of light, to be converted to electricity, may reach the p-type absorber layer 106 where photoconversion occurs. One way of obtaining a TCO stack 125 with a high optical transparency is by having each layer in the TCO stack 125 be as thin as possible. However, a thin TCO layer 103 may not contain enough conductive material for it to be highly conductive. Consequently, there needs to be a trade-off between having a highly conductive TCO layer 103 versus having a very thin TCO layer 103.

Optical constant values (e.g., refractive index, extinction coefficient) of the material from which each of the layers of the TCO stack 125 is formed can also affect the opto-electronic properties of the TCO stack 125. As described above, the optical constant values describe optical reflectance/transmission properties of each layer of the TCO stack 125; since sunlight must pass through the TCO stack 125 before reaching the absorber layer 106 and p-n junction where solar energy is converted to electricity, low reflectance and high transmission properties of the TCO stack are desired.

Since the opto-electronic properties of the TCO stack 125 are directly affected by the thicknesses of the layers of the TCO stack 125 and the optical constant values (e.g., refractive index, extinction coefficient) of the material from which each of the layers is formed, a controlled deposition of each of the layers comprising the TCO stack 125 is desired in order to consistently have devices 100 with a TCO stack 125 exhibiting desired opto-electronic properties. In order to properly control the deposition of the layers, measurement of each layer, immediately following the deposition thereof, is desired. The measurements can be used to calculate the thickness and optical constant values of each of the layers. In-line measurement and calculation allow for correction of the process parameters during a production batch, if necessary, to correct any deviations from the desired thicknesses and/or desired optical constant values.

Disclosed embodiments provide an in-line measurement system to provide detailed information in real-time about the characteristics of the various layers of the TCO stack 125. This is accomplished with the use of a multi-zone substrate coater that is equipped with both in-situ and ex-situ optical measurement systems, with measurements being possible after each of the layers is formed on a substrate as the substrate moves through the coater. Disclosed embodiments also include modeling software which uses the optical measurements taken by the optical measurement systems to calculate both the layer thicknesses and the optical constant values (e.g., refractive index, extinction coefficient) thereof. This calculation is achieved in-line and essentially in real-time during device 100 production.

Figure 2:
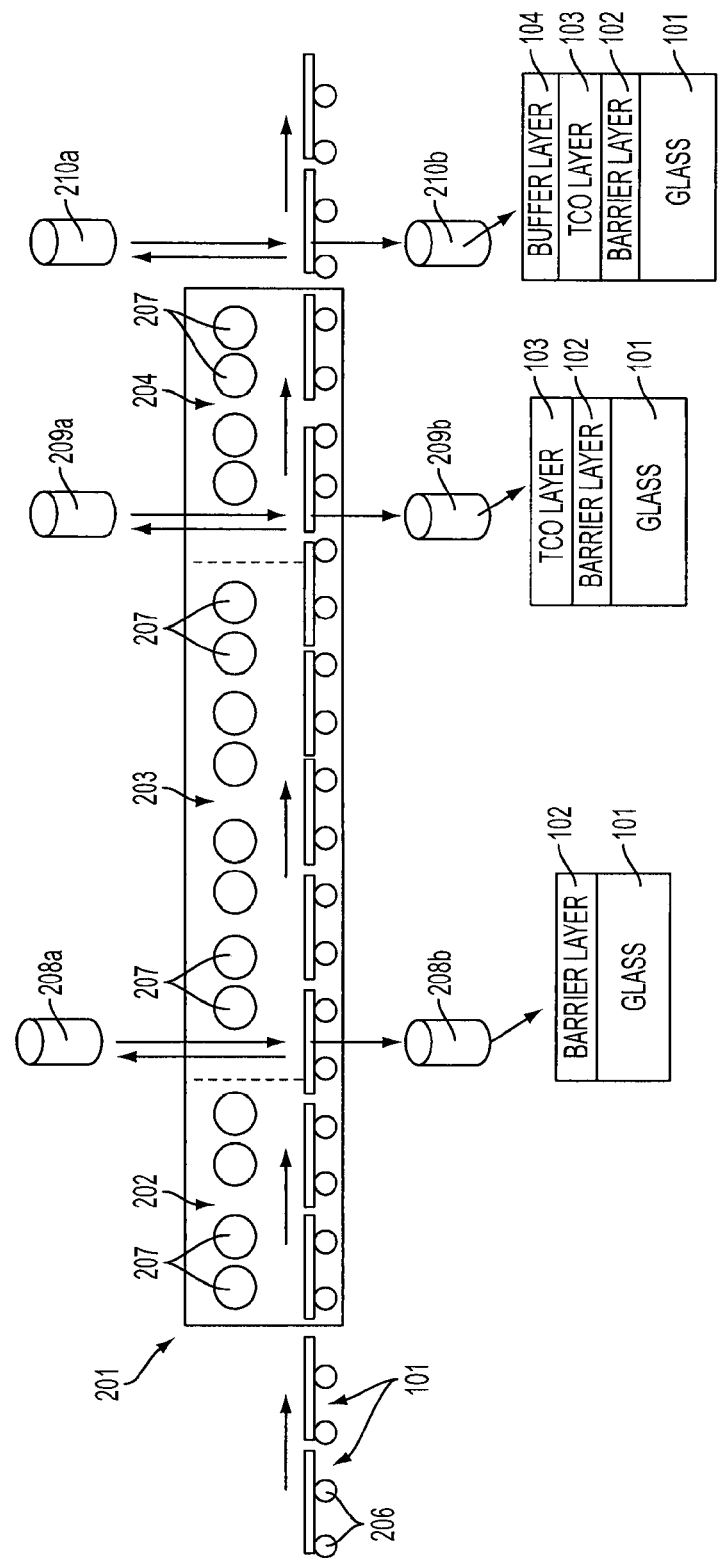
FIG. 2 is a schematic representation of a multi-zone glass coater having an in-line metrology system, in accordance with a disclosed embodiment.

FIG. 2 is a schematic representation of a production line device for forming a TCO stack 125 in accordance with disclosed embodiments. As seen in FIG. 2, the production line device includes a substrate coater 201, which includes multiple zones 202, 203, 204 for deposition of the various layers of the TCO stack 125. The coater 201 may be, for example, a vacuum coater, or any other type of suitable coater for depositing material layers. A series of substrates 101 onto which the TCO stack 125 is to be deposited, are conveyed into, through, and out of coater 201 by a conveyor system that may be formed by a series of rollers 206. These rollers 206 move the substrates 101 through the coater 201 at controlled traverse speeds. Each of zones 202, 203, and 204 contains a device, for example, sputter targets 207 shown in FIG. 2, for forming a desired layer on the substrate 101. The number of sputter targets 207 to be included in each zone depends on the particular deposition rate and desired thickness of the layer being formed in that zone. In the embodiment of FIG. 2, the barrier layer 102 is applied to the substrate 101 in zone 202, the TCO layer 103 is applied to the barrier layer 102 in zone 203 and the buffer layer 104 is applied to the TCO layer 103 in zone 204.

The production line device includes several optical measurement systems for measuring the layers as the substrate 101 moves through the coater 201. In-situ optical measurement systems 208, 209 are located within the coater 201 and enable the acquisition of optical data (e.g., reflection and/or transmission data, as discussed below) at the end of zones 202 and 203, after formation of each respective layer. Optical measurement system 208 acquires optical data of the glass substrate 101/barrier layer 102 stack. Optical measurement system 209 acquires optical data of the glass substrate 101/barrier layer 102/TCO layer 103 stack. An ex-situ optical measurement system 210 is located near the point at which the coated substrates leave coater 201. The ex-situ optical measurement system 210 acquires optical data of the completed TCO stack 125, after it exits the coater 201. It should be noted that additional optical measurement systems may be included in addition to those shown in FIG. 2. Additionally, although the coater 201 in the embodiment shown in FIG. 2 has three zones 202, 203, and 204, in other embodiments, there may be more or less zones depending on the particular configuration of the TCO stack 125.

Each optical measurement system 208, 209, 210 may include a pair of sensors 208$a/b$, 209$a/b$, 210$a/b$, respectively, positioned above and below the substrate 101. The sensors 208$a/b$, 209$a/b$, 210$a/b$ may be, for example, optical sensors of a photometry optical measurement system. As seen in FIG. 2, sensors 208$a$, 209$a$, 210$a$ are disposed facing the side of the substrate 101 that is being coated and sensors 208$b$, 209$b$, 210$b$ are disposed on the other side of the substrate 101. Also located near, or as part of, sensors 208$a$, 209$a$, 210$a$ is a light source. The optical measurement systems 208, 209, 210 illuminate the substrate 101 with a light beam from the light source of known intensity, $I_0$. Part of this light will be reflected from the coated surface of the substrate 101 with an intensity $I_R$, part of this light will be transmitted through the substrate 101 with an intensity $I_T$ and the remainder is absorbed $I_A$. Assuming there is no scattering, conservation of energy requires that $I_0 = I_R + I_T + I_A$. Measured reflection data ($I_R$) from the coated surface of the substrate 101 is acquired by sensors 208$a$, 209$a$, 210$a$ and measured transmission data ($I_T$) from light transmitted through the coated substrate 101 is acquired by sensors 208$b$, 209$b$, 210$b$. The optical measurement systems 208, 209, 210 use this measured data in conjunction with the known intensity of the light from the light source ($I_0$) to output curves for reflection ($R = I_R/I_0 * 100\%$) and/or transmission ($T = I_T/I_0 * 100\%$) over a range of wavelengths (e.g., 200 nm to 1400 nm; 400 nm to 1200 nm). FIGS. 6A and 6B, respectively, show sample reflection and transmission curves. In FIGS. 6A and 6B, multiple exemplary curves are plotted in each chart—each of the curves shown represents reflection or transmission measurement, respectively, for a single substrate. The measured reflection and/or measured transmission curves are used as inputs for an optical modeling software package 220 (FIG. 4), the implementation of which is described in more detail below.

Figure 3C:
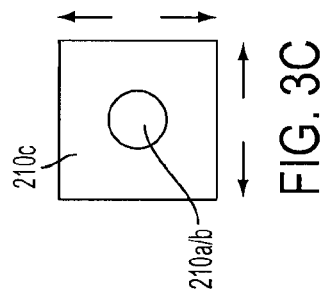
FIGS. 3A, 3B and 3C are a schematic representation of an ex-situ measurement system, in accordance with a disclosed embodiment.
Figure 3B:
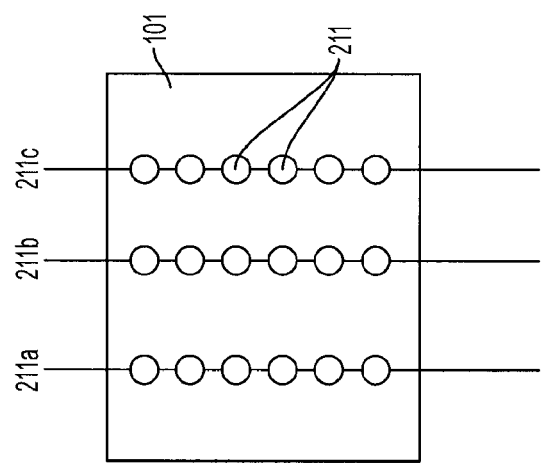
Figure 3A:
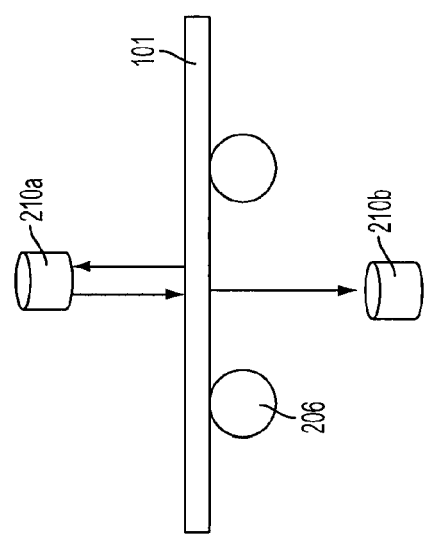

As illustrated in FIGS. 3A, 3B and 3C, the ex-situ optical measurement system sensors 210$a/b$ may be placed on movable x-y stages 210$c$ (top view seen in FIG. 3C), thereby making the ex-situ optical measurement system 210 capable of taking optical data at multiple positions 211 with respect to the substrate 101. One method by which this may be done is by performing multiple line scans (e.g., lines 211$a$, 211$b$, 211$c$) with multiple data points being taken at various positions 211 along each line. By using optical data at multiple positions 211 along the substrate 101, two-dimensional mapping of the TCO stack 125 may be obtained. This two-dimensional mapping allows for the measurement and detection of spatial variations or non-uniformity of the layers of the TCO stack 125. For example, variations in the thickness of the TCO stack 125 at different positions may be detected in this manner.

In other exemplary embodiments, variations of the described system may be provided. For example, ex-situ optical measurement system 210 may be movable only in a direction perpendicular to the direction of motion of the substrates 101, with collection of data along each of respective lines 211$a$, 211$b$, 211$c$. Alternatively, if two-dimensional mapping is not desired, then measurement system 210 could be located within the coater 201. Also, it could be possible that in-situ measurement systems 208, 209 include multiple sets of sensors 208$a/b$, 209$a/b$, 210$a/b$ arranged in a line perpendicular to the direction of motion of the rollers 206, in order to allow data to be obtained along multiple points of the coated substrates 101.

Figure 4:
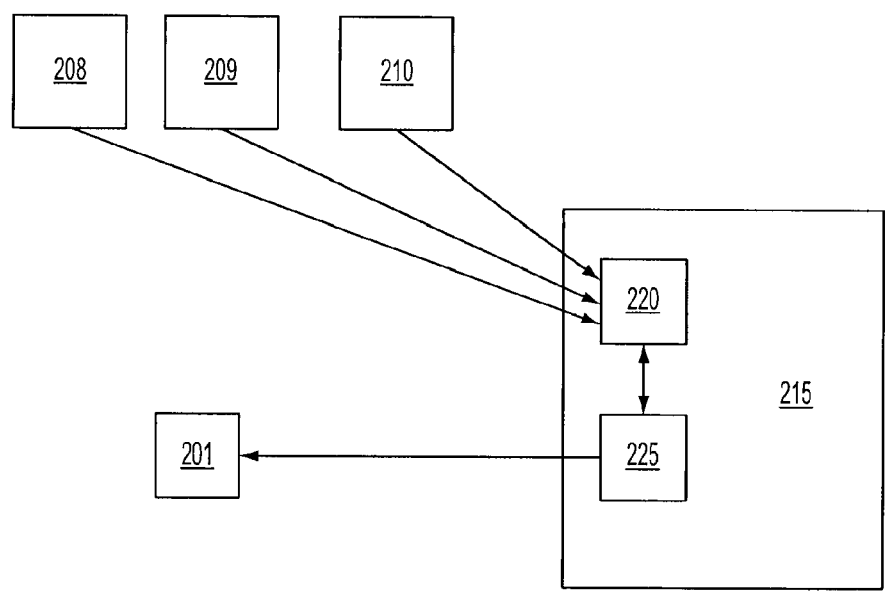
FIG. 4 is a schematic representation of a computer system including an optical modeling software package, in accordance with a disclosed embodiment.

Referring to FIG. 4, an exemplary embodiment of the optical modeling software package 220 is now described in more detail. The optical modeling software package 220 is implemented on a computer system 215 that is in communication at least with the optical measurement systems 208, 209, 210. The optical modeling software package 220 receives the optical data (measured transmission and/or reflection curves) acquired by each of the in-situ optical measurement systems 208, 209 and the ex-situ optical measurement system 210.

In one exemplary embodiment, the optical modeling software package 220 calculates the thickness and optical constant values for each of the TCO layer 103 and buffer layer 104, as the TCO stack 125 is formed. In this embodiment, thickness and optical constant values for the barrier layer 102 are not calculated during formation of the TCO stack 125 because similarities in the optical properties of the glass substrate 101 and barrier layer 102 limit the use of measured transmission and/or reflection curves to determine the properties of these layers when adjacent to each other. The thickness and optical constant values for the barrier layer 102 are pre-determined during a calibration process (which uses a dummy layer between the glass substrate 101 and barrier layer 102) that is discussed in detail below. The calibration process uses the optical data (measured transmission and/or reflection curves) acquired by the in-situ optical measurement system 208. The predetermined thickness and optical constant values for the barrier layer 102 are provided as inputs to the optical modeling software package 220.

In this embodiment, optical modeling software package 220 uses the optical data (measured transmission and/or reflection curves) acquired by the in-situ optical measurement system 209 and the ex-situ optical measurement system 210 as inputs. Other inputs to the optical modeling software package 220 include target thicknesses and target optical constant values (e.g., refractive index, extinction coefficient) of the TCO layer 103 and buffer layer 104. The target thicknesses may be input as the ideal, desired thickness values for each layer. This "desired" thickness is based on design parameters of the device. The target optical constant values may be, for example, the known, ideal textbook values of the particular material used for each layer. The pre-determined thickness and optical constant values of the barrier layer 102 (from the calibration process) are assumed to be fixed at a consistent value during modeling; thus these values are entered as additional inputs to the optical modeling software package 220. However, it should be noted that in some instances, where optical properties of the glass substrate 101 and barrier layer 102 are sufficiently different from each other to allow for determination thereof, then the thickness and optical constant values of the barrier layer 102 would not be provided as inputs to the optical modeling software package 220, but could be calculated based on the optical data (measured transmission and/or reflection curves) acquired by the in-situ optical measurement system 208, similar to the calculations now described with respect to the TCO layer 103 and optical measurement system 209.

The actual thickness and/or optical constant values for the layers of the TCO stack 125 will likely vary from the initial target values that are input to the optical modeling software package 220 (e.g., the desired thickness or the ideal, textbook optical constant values). This variance is due to, for example, manufacturing variances or material impurities. Using an imbedded optical model (which is stored as part of the optical modeling software package 220), a modeling analysis is performed (in-line and in a quasi-real time fashion) to calculate the thicknesses and/or optical constant values (e.g., refractive index, extinction coefficient) for each of the as-deposited layers formed on the substrate 101. The optical model uses the transmission and/or reflection data collected from the in-situ optical measurement system 209 and the ex-situ optical measurement system 210, along with the other inputs to the optical modeling software package 220 discussed above (e.g., the target thickness and optical property values), to calculate the actual thickness and/or optical constant values for the layers of the TCO stack 125.

The specifics of the imbedded optical model are based on the particular coating design; however a non-limiting example of how the optical model handles this calculation is now described. As noted above, each optical measurement system 208, 209, 210 generates measured reflection (R) and/or transmission (T) curve(s) for a glass substrate 100 over a range of wavelengths, for example, as shown in FIGS. 6A and 6B. The range of wavelengths may be, for example, 200 nm to 1400 nm or 400 nm to 1200 nm. Measurements may be taken, for example, at 1 nm increments, or even finer increments depending on the processor capabilities of the system.

As an example, a description of how the thickness and optical constant values for the TCO layer 103 are determined, using data from optical measurement system 209, is now described in more detail. The thickness and optical constant values for the buffer layer 104 may be determined in a similar manner, using optical data from optical measurement system 210. Optical measurement system 209 acquires optical data of the stack that includes glass substrate 101/barrier layer 102/TCO layer 103. The thickness and optical constant values of the glass substrate 101 are known (e.g., from the manufacturer or testing prior to layer deposition) and the thickness and optical constant values of the barrier layer 102 are assumed to be the consistent, pre-determined values from a prior calibration process that are input to the optical modeling software package 220 (as mentioned above). The calibration process itself is discussed in more detail below. The optical data acquired by optical measurement system 209 consists of a single transmission curve and a single reflection curve, along the range of wavelengths. The transmission and reflection data that is collected by the optical measurement system 209 is affected by the properties of each of the individual layers of the stack, as well as the interfaces between the layers (e.g., the light may go through the TCO layer, but reflect at the interface between the TCO layer and the barrier layer).

The basic principle of determining the unknown values is based on the known properties of transmission of electromagnetic waves in multiple layers of materials. There are many well-developed and well-known methods of using measurements of reflection and transmission data to yield the unknown values of film properties, such as thickness, refractive index and extinction coefficient. Specifics of these methods are described in many textbooks relating to physics, generally, or to properties of thin films, more specifically. One such textbook is, for example, O. S. Heavens, *OPTICAL PROPERTIES OF THIN SOLID FILMS*, Dover Publications, Inc., New York, New York (1991) (originally published in 1955). As indicated in this text, "explicit, single expressions for the reflectance and transmittance of systems of many films are cumbersome and of no great use." Many methods for solving for the unknowns in a multi-layer thin-film system are described therein (e.g., Schopper's method, Male's method) and the textbook (which includes these descriptions) is incorporated by reference herein. The optical modeling software uses these known relationships between transmission/reflection and stack properties, in order to generate simulated R and/or T curves (using the inputted target thickness and target optical constant values of the TCO layer 103). The optical modeling software can be any commercially available optical simulation software package that is typically used for thin film analysis. Examples of such software packages include OptiLayer's OptiRE software package, W. Theiss Hard- and Software's BREIN software package, and Software Spectra, Inc.'s TFCalc software package. The optical modeling software generates a simulated R and/or T curve, over the same range of wavelengths used for the measured curves. The simulated R and/or T curves are also similar to those shown in FIGS. 6A and 6B.

The optical modeling software systematically varies the value of each of the properties being calculated (e.g., thickness and optical constant values for the TCO layer 103, in the example described with respect to optical measurement system 209) from the original input target values of thickness and optical properties and several sets of simulated T and R curves are generated using the systematically varied values. For both the T and R curves, each of the several simulated curves and the measured curve are compared. Differences between the simulated curves and the measured curve are calculated and this calculated difference between the simulated and measured curves is minimized to find which simulated curve most closely matches the measured curve. The values of the properties being calculated that correspond to the best fitting curve are determined to be the values of these properties for the as-deposited TCO layer 103.

The difference between each simulated curve and the measured curve is calculated by finding the T (or R) value at specific wavelengths along each of these two curves, determining an absolute value of the difference between these two values, and summing these absolute values. For example, a pair of T (or R) values (e.g., simulated and measured) can be found for six wavelengths along the range of wavelengths on the curves, subtracting each of these pairs of values to determine an absolute value of the difference between them, and adding these six absolute value numbers together to get a representative difference value to describe the difference between the simulated curve and the measured curve. The difference between the simulated and measured curves is minimized by selecting the simulated curve that results in the lowest representative difference value. In another example, the simulated/measured curve pairs are subtracted, this value is squared, and then the sum of all these squared differences is the representative difference value. The simulated curve which provides the lowest representative difference value when compared to the measured curve is the best-fitting curve with respect to the measured curve from sensor 209.

The final outputs from the modeling software will be the set of the systematically varied input values for the properties being calculated (e.g., thickness and optical constant values for the TCO layer 103, originally based on the input target thickness and optical property values) that corresponds to the simulated curve that is determined to be the best-fitting curve with respect to the measured curve from sensor 209. The output values from the best fitting curve provide the calculated value of thickness and optical constants of the as-deposited TCO layer.

A similar process of measurement, generation of simulated curves, and analysis to find the best-fitting curve is used to determine the thickness and optical constant values of buffer layer 104, based on data obtained from optical measurement system 210 and target thickness and optical constant values for the buffer layer 104. In this instance, the calculated values for the thickness and optical constants of the as-deposited TCO layer 103 are also used as inputs to the optical modeling software package 220. Alternatively, rather than determining the properties of the TCO layer 103 using only the data from the optical measurement system 209 and, subsequently, determining the properties of the buffer layer 104 using the data from the optical measurement system 210 and results from the analysis of the TCO layer 103, the computer system 215 may perform the analysis using both sets of measurements (e.g., from optical measurement system 209 and optical measurement system 210) at the same time, such that the calculations of the properties of the TCO layer 103 and of the buffer layer 104 are coupled together. The noted commercial software packages are capable of either calculation method. Further, as noted above, if the thickness and optical constant values of barrier layer 102 are being calculated rather than determined from a calibration process, a similar process may be used for this determination as well, using data obtained from optical measurement system 208.

For each substrate 101 coated with a TCO stack 125, the outputs of the modeling analysis include calculated thicknesses and calculated optical constant values (e.g., refractive index, extinction coefficient) of TCO layer 103 and buffer layer 104. The modeling analysis outputs may also indicate temporal variations of any of these individual outputs between and among substrates 101, by flagging for the operator when differences occur between, for example, layer thicknesses, among different substrates 101 exiting the coater 201. The results of the optical modeling may be automatically displayed to an operator or may be stored in computer system 215. Calculations for each coated substrate 101 are commenced by the optical modeling software package 220 after receiving the optical data relating to that substrate from each of the in-situ optical measurement systems 208, 209 and from the ex-situ optical measurement system 210, and are completed before the next coated substrate 101 exits the coater 201.

The computer system 215 may also include a controller 225 in communication with the coater 201, including rollers 206 and the deposition system 207 of each zone 202, 203, 204. The modeling analysis output may be used for both monitoring and control of the deposition conditions for the TCO layer 103 and the buffer layer 104. For example, if the calculated thicknesses of the TCO layer 103 and/or the buffer layer 104 are not at desired values (e.g., the value of the design specification), the controller 225 may signal the deposition system of the respective zones 202, 203 to cause a change in the deposition conditions for production of subsequent substrates 101. For example, if the result of the modeling shows that the TCO layer 103 has, e.g., a thickness value outside of an acceptable range (e.g., beyond +/−5% of the desired thickness), then the controller will change the deposition conditions for zone 203 (in which the TCO layer is formed) for forming the TCO layer on subsequent substrates of the production. For a sputter deposition of a material, this may include, for example, a change in the power used to sputter the material in order to bring the thickness back with the desired range. The thickness is generally linearly related to the sputtering power. If the thickness is higher than desired, sputtering power will be reduced by the controller; if the thickness is lower than desired, sputtering power will be increased by the controller. Adjusting the conveyor speed may also be used as a means to adjust the thickness of a layer, but is generally kept constant for multi-layer production to avoid affecting the thickness of other layers in the stack.

As indicated above, the barrier layer 102 may have very similar optical properties as the glass substrate 101 itself, such as for barrier layers formed of $SiO_2$ of $SiAlO_x$. This makes it difficult to determine the thickness and optical constant values of the barrier layer 102 when it is directly adjacent to the glass substrate 101, because the transmission/reflection data will not indicate an interface between the two layers. This is the reason for the assumed constant thickness and optical constant values of the barrier layer 102 in the modeling example discussed above. In order to allow for more accurate and reliable deposition of the barrier layer 102, a calibration process may be implemented where measurement of the deposited barrier layer 102 is made possible by pre-coating a glass substrate 101 with a dummy layer having different optical properties from glass substrate 101 and the barrier layer 102. The dummy layer may be, for example, a high index material with well-defined, known optical properties and a known thickness, such as a $SnO_2$ layer, or any other suitable layer having known optical properties and a known thickness. A barrier layer 102 is then deposited on the dummy layer and reflection and/or transmission data is obtained by optical measurement system 208. Modeling analysis is performed by the optical modeling software package 220 to determine the as-deposited thickness and optical constant values (e.g., refractive index, extinction coefficient) of barrier layer 102. This modeling analysis is performed by the optical modeling software package 220 in a similar manner as discussed above with respect to determining the properties of TCO layer 103, but using the data from optical measurement system 208 rather than from optical measurement systems 209, 210. Simulated R and T curves are generated by the optical modeling software package 220 based on input target thickness and optical constant values. The measured curves are compared to the simulated curves and a best fitting simulated curve, as compared to the measured curves from optical measurement system 208, is determined. The thickness and optical constant values associated with the best fitting curve are the calculated thickness and optical constant values for the as-deposited barrier layer.

The modeling analysis of the barrier layer 102, using this dummy layer, may be used in order to calibrate and set up the deposition conditions to be used for formation of the barrier layer 102 in actual production devices 100 (e.g., devices produced without the dummy layer). In calibration, the outputs of the modeling analysis are compared to a desired thickness and optical constant values for the barrier layer 102 (the "desired" values being based on design specifications); if necessary, deposition parameters (such as temperature, pressure, or speed of travel of substrate 101 through zone 202) may be adjusted. This process may be repeated until appropriate deposition parameters for barrier layer 102 (e.g., parameters that result in a barrier layer having the target thickness and optical constant values) are determined and stored. The modeling analysis using the dummy layer substrate may also be repeated intermittently during production to check for variations in the deposition of the barrier layer 102. It should be noted that this dummy layer is not generally included in the production photovoltaic device 100. It is used as a means of calibrating and monitoring the deposition conditions for the barrier layer 102.

Figure 5A:
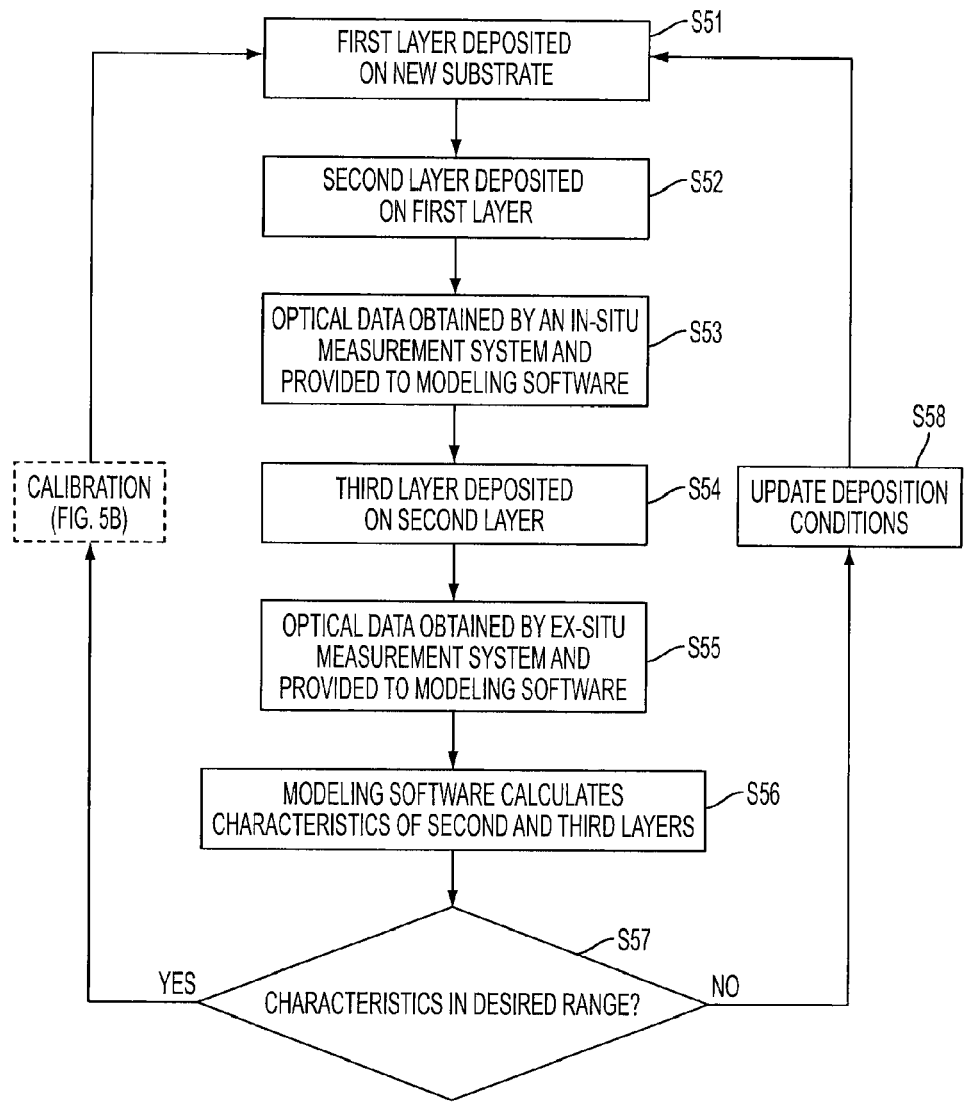
FIGS. 5A and 5B are a flowchart showing a general method of operation of a TCO production system, in accordance with a disclosed embodiment.
Figure 5B:
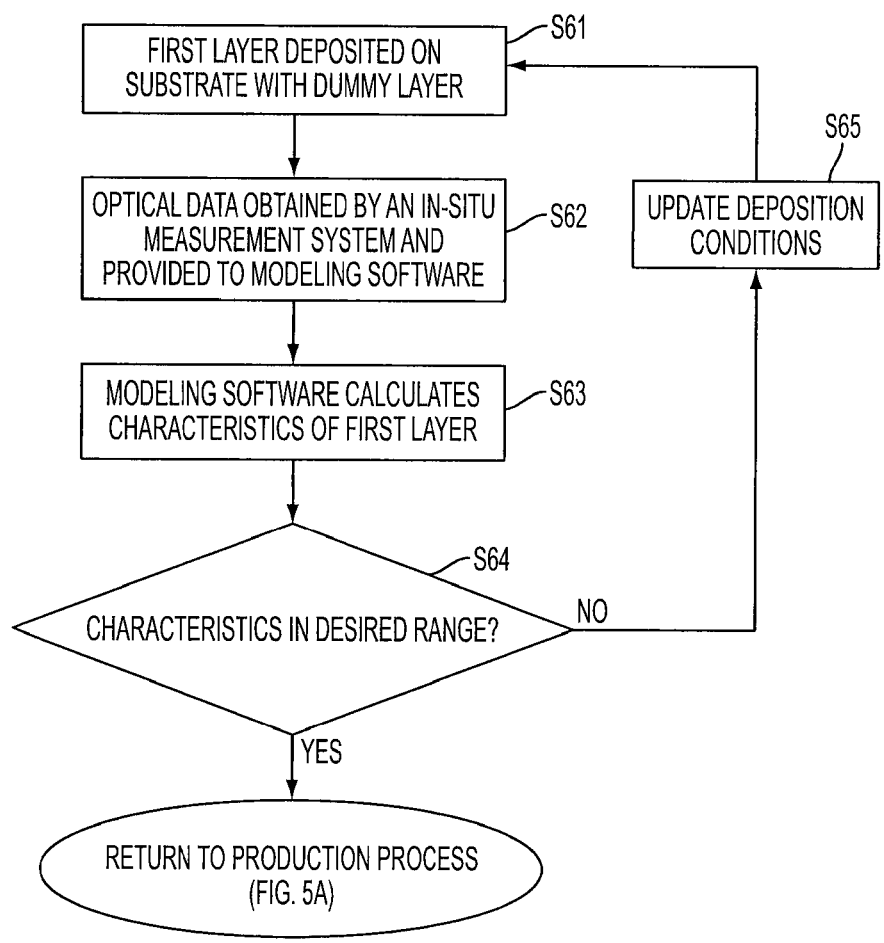

FIGS. 5A and 5B include a flowchart showing the general method of operation of the coater, optical measurement systems and optical modeling software package in a production environment. Referring to FIG. 5A, in step S51, a substrate 101 enters the coater and a first layer (e.g., barrier layer 102) is deposited thereon. In step S52, a second layer (e.g., TCO layer 103) is deposited on the first layer. In step S53, reflection and/or transmission data regarding the substrate with the first and second layers deposited thereon is obtained by an in-situ optical measurement system (e.g., optical measurement system 209) and reflection and/or transmission curves regarding this data are provided as inputs to an optical modeling software package (e.g., optical modeling software package 220). In step S54, a third layer (e.g., buffer layer 104) is deposited on the second layer. In step S55, reflection and/or transmission data regarding the substrate with the first, second and third layers deposited thereon is obtained by an ex-situ optical measurement system (e.g., optical measurement system 210) and reflection and/or transmission curves regarding this data are provided as inputs to the optical modeling software package. At step S56, the optical modeling software package uses these input reflection and/or transmission curves, along with input target values for thickness and optical constants, to determine the characteristics of each of the second and third layers, such as, e.g., layer thickness and optical constants thereof. At step S57, the determined characteristics are compared to desired values for these layer characteristics. If it is decided that the determined characteristics are sufficiently close to the desired values ("Yes" at S57), the next substrate enters the coater (step S51) and the process is repeated. If it is decided that the determined characteristics are not sufficiently close to the desired values ("No" at S57), deposition conditions within the coater are updated to address the deviation (step S58) before the next substrate enters the coater (step S51) and the process is repeated.

After several devices have been formed, a calibration check with respect to the deposition of the first layer may be completed, as illustrated in the flowchart shown in FIG. 5B. This calibration check may be necessary if, for example, optical properties of the first layer are too similar to those of the substrate for accurate measurement of the first layer to be performed on a production device. The calibration may occur, for example, at the beginning of each work shift, once per day, or at any other appropriate time interval. Alternatively, the calibration may occur after a particular number of devices have been produced. At step S61, a substrate with a dummy layer (having a known thickness and optical properties) deposited thereon enters the coater and the first layer is deposited thereon. In step S62, reflection and/or transmission data regarding the substrate with the dummy and first layers deposited thereon is obtained by an in-situ optical measurement system (e.g., optical measurement system 208) and reflection and/or transmission curves regarding this data are provided as inputs to an optical modeling software package (e.g., optical modeling software package 220). At step S63, the optical modeling software package uses these inputs, along with any other data provided as inputs thereto, to determine the characteristics of the first layer, such as, e.g., layer thickness and optical constant values thereof. At step S64, the determined characteristics for the first layer are compared to desired values for this layer. If it is decided that the determined characteristics are not sufficiently close to the desired values ("No" at S64), deposition conditions within the coater are updated to address the deviation (step S65) and the process of steps S61-S64 is repeated until it is decided that the determined characteristics are sufficiently close to the desired values ("Yes" at S64). Once it is decided that the determined characteristics are sufficiently close to the desired values ("Yes" at S64), the calibration sequence ends, the deposition conditions for the first layer are stored. A next substrate enters the coater (step S51, FIG. 5A) and the production process continues using these stored deposition conditions for depositing the first layer.

The disclosed embodiments allow for in-line, real-time monitoring of the thickness of the layers of the TCO stack 125, based on data taken by a combination of in-situ and ex-situ optical measurement systems 208, 209, 210. The disclosed embodiments also allow for in-line, real-time monitoring of variations in the thicknesses of these layers within a TCO stack 125 or between and among several TCO stacks 125 produced on the same line. The in-line measurement capabilities allow for quick detection of process excursions as well as in-line adjustment of the deposition parameters to ensure consistent production of the TCO stack 125. In previously used methods that do not allow for in-line, real-time monitoring, several TCO stacks 125 may be manufactured before process excursions are discovered.

The embodiments described above are offered by way of illustration and example. It should be understood that the examples provided above may be altered in certain respects and still remain within the scope of the claims. It should be appreciated that, while the invention has been described with reference to the above described preferred embodiments, other embodiments are within the scope of the claims.

What is claimed as new and desired to be protected by Letters Patent of the United States is:

1. A method of monitoring formation of a transparent conductive oxide (TCO) stack formed on a substrate, the TCO stack comprising a plurality of layers, the method comprising:

acquiring a first set of optical data from a first optical measurement system, the first set of optical data being transmission and/or reflection of a first optical signal passing through and/or reflected from an intermediate stack comprising less than all of the plurality of layers of the TCO stack;

acquiring a second set of optical data from a second optical measurement system, the second set of optical data being transmission and/or reflection of a second optical signal passing through and/or reflected from the plurality of layers of the TCO stack; and using the first and second sets of optical data to determine at least one of a layer thickness and an optical constant value of at least one of the plurality of layers of the TCO stack.

2. The method of claim 1, wherein the TCO stack comprises, a barrier layer, a TCO layer, and a buffer layer, and wherein the intermediate stack comprises the barrier layer and the TCO layer, and wherein the first and second sets of optical data are used to determine at least one of a layer thickness and optical constant value of the TCO layer and the buffer layer.

3. The method of claim 1, wherein the first and second sets of optical data are acquired by the first and second optical measurement systems in real-time with formation of the TCO stack.

4. The method of claim 1, wherein the first optical measurement system is an in-situ optical measurement system and the second optical measurement system is an ex-situ optical measurement system.

5. The method of claim 4, wherein the second optical measurement system obtains data from a plurality of locations of the TCO stack.

6. The method of claim 5, wherein the second optical measurement system is mounted on a movable stage.

7. The method of claim 1, wherein the determining step determines a thickness of the at least one layer.

8. The method of claim 1, wherein the determining step determines a refractive index value of the at least one layer.

9. The method of claim 1, wherein the determining step determines an extinction coefficient value of the at least one layer.

10. The method of claim 2, wherein the determining step is performed by an optical modeling software package stored on and operated by a computer system.

11. The method of claim 10, wherein the first and second sets of optical data are provided as inputs to the optical modeling software package.

12. The method of claim 10, wherein an output of the optical modeling software package includes a thickness of the TCO layer and a thickness of the buffer layer.

13. The method of claim 10, wherein an output of the optical modeling software package includes a refractive index value of the TCO layer and a refractive index value of the buffer layer.

14. The method of claim 10, wherein an output of the optical modeling software package includes an extinction coefficient value of the TCO layer and an extinction coefficient value of the buffer layer.

15. The method of claim 5, further comprising performing two-dimensional mapping of the TCO stack using the second set of optical data.

16. The method of claim 1, further comprising:
comparing the determined at least one of a thickness and optical constant value to a desired value; and
adjusting deposition parameters of at least one of the plurality of layers, for use in formation of a subsequent TCO stack, based on the comparing step.

17. The method of claim 2, further comprising:
acquiring a third set of optical data from a third optical measured system, the third set of optical data being transmission and/or refraction of a third optical signal passing through the substrate and barrier layer, and wherein the first set of optical data is obtained from the first optical signal passing through and/or reflected from the substrate, barrier layer and TCO layer, and the second set of optical data is obtained from the second optical signal passing through and/or reflected by the substrate, barrier layer, TCO layer and buffer layer.

18. The method of claim 1, wherein the TCO stack comprises a TCO layer and a buffer layer over the TCO layer and the first and second sets of optical data are used to determine at least one of a thickness and optical constant value of the TCO layer, and buffer layer.

19. The method of claim 18, wherein the optical constant value comprises at least one of a reflective index value and an extinction coefficient value.

20. A system for formation of a multi-layered stack on a substrate, the system comprising:
a plurality of deposition zones, each deposition zone configured to deposit a separate layer of the multi-layered stack;
at least one in-situ optical measurement system for acquiring at least a first set of optical data regarding an intermediate multi-layered stack passing through the plurality of deposition zones;
an ex-situ optical measurement system for acquiring a second set of optical data regarding a complete multi-layer stack after the multi-layered stack exits the plurality of deposition zones; and,
a computer for receiving the first and second sets of optical data and determining at least one of a thickness and an optical constant value of at least one of the layers of the complete multi-layer stack.

21. The system of claim 20, further comprising a plurality of in-situ optical measurement systems for obtaining optical data regarding a plurality of intermediate multi-layered stacks.

22. The system of claim 21, wherein a first in-situ optical measurement system is located between first and second deposition zones; and
wherein a second in-situ optical measurement system is located between the second and a third deposition zones.

23. The system of claim 20, wherein the at least a first set of optical data acquired from the at least one in-situ optical measurement system and the second set of optical data acquired from the ex-situ optical measurement system comprises transmission and/or reflection data of the intermediate multi-layered stack and the complete multi-layer stack, respectively.

24. The system of claim 20, further comprising conveyors for conveying a plurality of substrates onto which the multi-layered stack is to be deposited through the plurality of deposition zones.

25. The system of claim 20, further comprising an optical modeling software package stored on and operated by a computer, the optical modeling software package receiving inputs from each of the at least one in-situ optical measurement system and the ex-situ optical measurement system.

26. The system of claim 25, wherein the optical modeling software package causes the computer to output at least one of a thickness and an optical consant value for at least two layers of the complete multi-layered stack.

27. The system of claim 26, wherein the optical consant value for the at least two layers comprises information regarding each layer of the complete multi-layered stack comprises at least one of a refractive index value and an extinction coefficient value.

28. A method of calibrating deposition parameters of a barrier layer of a transparent conductive oxide (TCO) stack formed on a substrate, the TCO stack comprising, the barrier layer, a transparent conductive oxide layer, and a buffer layer, the method comprising:

providing a substrate with a dummy layer having known optical characteristics and thickness formed thereon;

depositing the barrier layer on the dummy layer;

acquiring a first set of optical data from a first optical measurement system, the optical data being transmission and/or reflection of an optical signal passing through and/or reflected from a stack comprising the substrate, the dummy layer and the barrier layer;

using the first set of optical data to determine a thickness and optical properties of the barrier layer;

comparing the determined thickness and optical properties of the barrier layer to a desired thickness and optical properties of the barrier layer; and adjusting deposition parameters of the barrier layer, for a subsequent substrate, based on the comparing step.

29. The method of claim 28, further comprising:

repeating the steps until the determined thickness and optical properties of the barrier layer are substantially equal to the desired thickness and optical properties of the barrier layer; and storing the associated deposition parameters for use in forming a TCO stack.

\* \* \* \* \*